United States Patent [19]

Charbonnier

[11] Patent Number: 4,637,069
[45] Date of Patent: Jan. 13, 1987

[54] DOUBLY BALANCED DIODE MIXER COMPRISING A RING MODULATOR EACH LEG OF WHICH COMPRISES A HIGH SPEED CONVENTIONAL DIODE IN SERIES WITH AT LEAST ONE DIODE OF THE "VARACTOR" KIND

[75] Inventor: Roger Charbonnier, Meudon Bellevue, France

[73] Assignee: Adret Electronique, France

[21] Appl. No.: 714,401

[22] Filed: Mar. 21, 1985

[30] Foreign Application Priority Data

Mar. 26, 1984 [FR] France ................. 84 04634

[51] Int. Cl.⁴ ............................................. H04B 1/26
[52] U.S. Cl. ................... 455/330; 455/326; 455/332; 332/43 B
[58] Field of Search ........ 455/325, 326, 327, 330–332; 332/43 B, 47; 307/257, 321

[56] References Cited

U.S. PATENT DOCUMENTS

| | | | |
|---|---|---|---|
| 2,945,950 | 7/1960 | Midkiff | 332/47 |
| 3,413,571 | 11/1968 | Ulrick et al. | 332/47 |
| 3,939,429 | 2/1976 | Lohn et al. | 455/327 |
| 4,534,062 | 8/1985 | Levinson | 455/330 |

OTHER PUBLICATIONS

"Wide Band Modulator" by Laczko, IBM Technical Disclosure Bulletin, vol. 2, No. 4, 12/1959.

*Primary Examiner*—Jin F. Ng
*Attorney, Agent, or Firm*—William A. Drucker

[57] ABSTRACT

A doubly balanced mixer comprising a ring modulator each leg of which is formed by the series connection of a high speed switching diode and one or more diodes with low intrinsic resistance and with high accumulated charges, preferably of the "varactor" or "PIN" type.

9 Claims, 2 Drawing Figures

DOUBLY BALANCED DIODE MIXER COMPRISING A RING MODULATOR EACH LEG OF WHICH COMPRISES A HIGH SPEED CONVENTIONAL DIODE IN SERIES WITH AT LEAST ONE DIODE OF THE "VARACTOR" KIND

BACKGROUND OF THE INVENTION

Doubly balanced mixers are widely used in telecommunications equipment (receivers, transmitters), radar, television, electronic instrumentation, etc . . . , whenever it is required to convert an incident signal of given frequency into an output signal of a different frequency, by additive or subtractive mixing with a high level auxiliary signal of suitable frequency.

The invention relates more particularly to doubly balanced mixers of the type comprising a ring modulator with four identical rectifying legs each comprising at least one diode.

A first transformer comprises a primary winding receiving the incidence signal (commonly called "RF port"), and a secondary winding with central tapping; a second transformer, similar to the first one, comprises a primary winding receiving the auxiliary signal (commonly called "LO port") and a secondary winding with central tapping. The ring modulator has its diagonals connected respectively to the terminals of the secondary windings of the two transformers and an "output port", commonly called "IF port", is connected to the central tappings of said secondary windings.

The known theory of such modulators shows that the IF output signal has two main frequency components given by the formula $F_{IF}=F_{LO}\pm F_{RF}$, the desired component being selected for example by filtering.

In a first approximation, the different modulations which affect the RF signal (amplitude, phase, frequency and combinations thereof) also affect the IF signal.

Since the level of the auxiliary LO signal is assumed sufficiently high to cause alternate conduction of the two pairs of rectifiers, assumed perfect, which form the modulator ring and since the transformers are assumed to be perfect and of a ratio ½ (each half of the secondary comprising as many turns as the primary), theory shows that the amplitude of each component of the IF signal is equal to that of the RF signal multiplied by $2/\pi$, i.e. an attenuation of 4 dB.

In practice, the balanced mixers of the prior art are tainted with different defects due to the losses in the transformers (additional attenuation) and especially to the imperfection of conventional high-speed diodes which form the legs of the ring modulator, which causes an attenuation increasing at the same time as the level of the RF signal (saturation), and the appearance of undesirable parasite signals corresponding to a distorsion and to intermodulation products.

SUMMARY OF THE INVENTION

The invention provides then a doubly balanced mixer free from the above-mentioned defects and in which each leg of the ring modulator is formed by the series connection in the same direction of a high-speed switching diode and one or more additional diodes with intrinsic resistance substantially equivalent to that of perfect junction and with an accumulated charge of at least several nanocoulombs.

BRIEF DESCRIPTION OF THE DRAWINGS

The invention will be better understood from the following description. In the accompanying drawings.

DESCRIPTION OF THE PREFERRED EMBODIMENT

Figure 1:
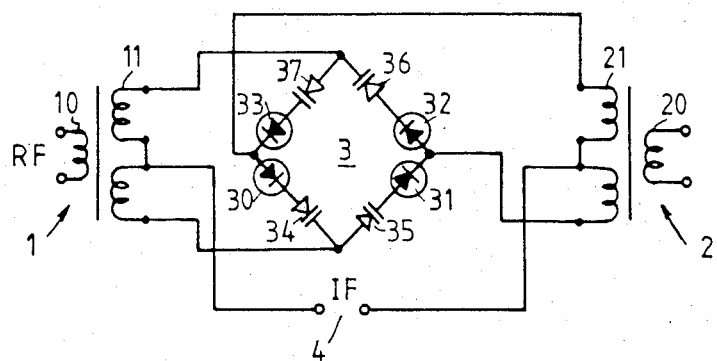
FIG. 1 shows a doubly balanced mixer in accordance with a preferred embodiment.

In FIG. 1 has been shown a first transformer 1 having a primary winding 10 which receives the RF frequency and a secondary winding 11 having a center tapping. A second transformer 2 has a primary 20 which receives the frequency LO and a secondary 21. A ring modulator 3 has its respective diagonals situated at the terminals of the secondaries 11 and 21. Each of its four legs comprises a high-speed switching diode—30 to 33 respectively—and an additional diode 34 to 37 respectively. Two varactor diodes in series with the high speed diode could be used in each leg. The center tappings of the secondaries 11-21 are connected to the IF port designated by the reference number 4.

The high speed diodes 30 to 33 are advantageously of the metal-semiconductor (silicon for example) junction type or else of the PN junction type. The additional diode or diodes are advantageously of the "varactor" type with high capacity and low intrinsic resistance, or else of any other type of diode having a high accumulated charge and low dynamic resistance, such as PIN switching diodes with long carrier life.

Figure 2:
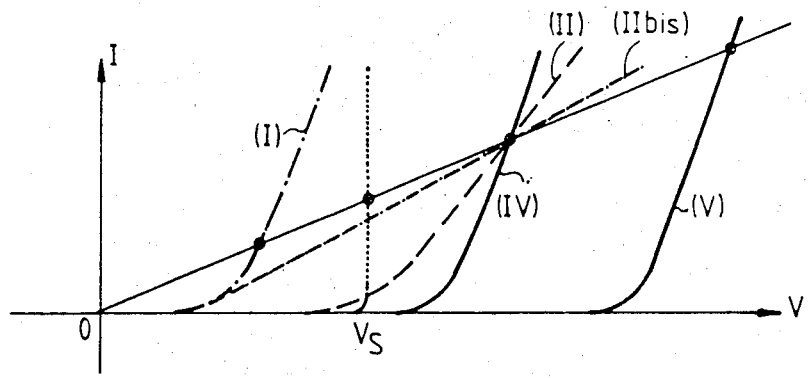
FIG. 2 shows characteristic curves of the current as a function of the voltage of the terminals respectively of one ring modulator leg in accordance with the invention (continuous line curve), and of a ring modulator leg of the prior art (broken line curves).

In FIG. 2, the curve (I) corresponds to a first known ring modulator leg structure of the type commonly called "class I", formed from a single high speed diode, curve (II) corresponds to a second known structure, designated "class II" and comprising two identical high speed diodes in series; the curve (II bis) corresponds to a third known structure, designated "class II bis" and comprising a high speed diode in series with a resistor, no curve has been given for a third known structure designated "class III" and comprising, in series with a high speed diode, a parallel resistor across which a capacitor is connected.

The theoretic curve corresponding to a ring modulator leg structure which would correspond to an ideal diode has been shown with a dotted line: the passing current would be strictly zero for reverse biasing and forward biasing, for all the values of V less than a threshold $V_S$. For this value of V, the current would be abruptly established with a zero dynamic impedance of the diode in the conducting phase. The admissible peak voltage of the RF signal would be equal to $V_S$.

Since such a perfect diode does not exist, the modulator will be all the better the more abrupt the bend of the characteristics of the diodes, and so the lower the dynamic impedance in the passing direction and the higher the conduction threshold.

Now, it can be seen (continuous line curves IV and V corresponding respectively to the use of one or two "varactor" diodes in series with a high speed diode) that, for a modulator leg in accordance with the invention, the conduction threshold is much higher than with known circuits and that the dynamic resistance is practically equivalent to that of class I. This remarkable result is obtained even for relatively low IF frequencies whereas, for such frequencies, the class III circuit is no longer possible in practice, since the value of the capacity which it would have to comprise would then be prohibitive.

Moreover, the circuit of the invention is not at all comparable with that of class III, the "varactor" diode used here with forward biasing being then equivalent to a source of electromotive force with extremely low internal resistance (for example 3 ohms for a peak voltage of 800 mV, the current then being 14 mA), in parallel across a fixed capacitor of high capacity (corresponding to an accumulated charge of 15 to 50 nanocoulombs for example). By way of example, a conventional diode has an intrinsic resistance of 14 ohms for example and an accumulated charge which is expressed in picocoulombs. The circuit of the invention is therefore completely different from class II.

Considering the very low intrinsic resistance of "varactor" diodes and their high capacity in the passing direction, the dynamic impedance at the operating point, defined by the intersection of the characteristic curve with the straight load line (shown in FIG. 2) determined by the nominal impedance of the LO signal, is practically equal to that of the high speed diode alone.

The circuit described is easy to construct whatever the value of the IF frequency.

What is claimed is:

1. A double balanced mixer comprising:
   i—a four leg ring modulator having four identical rectifying legs with each leg comprising a high speed diode connected in series with at least an additional diode different from said high speed diode and having an intrinsic resistance of the same order of magnitude as that of a perfect junction and with an accumulated charge of at least several nanocoulombs; the respective high speed diodes and additional diodes of the respective legs being arranged in a common current flow direction around the four leg ring modulator and four ring modulator terminals being each positioned between two of the said legs;
   ii—a first signal input transformer having a primary winding and a balanced center tapped secondary winding with opposite terminals connected to a first opposite pair of said ring modulator terminals;
   iii—a second signal input transformer having a primary winding and a balanced center tapped secondary winding with opposite terminals connected to a second opposite pair of said ring modulator terminals; and
   iv—a pair of output terminals connected to the respective center tappings of the secondary winding of the respective first and second input transformers.

2. The mixer as claimed in claim 1, wherein the high speed diode is of the metal-semiconductor junction type.

3. The mixer as claimed in claim 2, wherein the additional diode is of "varactor" type.

4. The mixer as claimed in claim 2, wherein the additional diode is of the PIN switching type with long carrier life.

5. The mixer as claimed in claim 1, wherein the high speed diode is of the P-N junction type.

6. The mixer as claimed in claim 5, wherein the additional diode is of the PIN switching type with long carrier life.

7. The mixer as claimed in claim 5, wherein the additional diode is of the "varactor" type.

8. The mixer as claimed in claim 1, wherein the additional diode is of the "varactor" type.

9. The mixer as claimed in claim 1, wherein the additional diode is of the PIN switching.type with long carrier life.

* * * * *